United States Patent [19]

Hisamoto et al.

[11] Patent Number: 6,060,750

[45] Date of Patent: May 9, 2000

[54] SEMICONDUCTOR DEVICE HAVING SOI-MOSFET

[75] Inventors: Dai Hisamoto, Albany, Calif.; Yoshimi Sudou, Akiruno, Japan

[73] Assignee: Hitachi, Ltd., Tokyo, Japan

[21] Appl. No.: 08/998,887

[22] Filed: Dec. 29, 1997

[30] Foreign Application Priority Data

Dec. 26, 1996 [JP] Japan ................................. 8-347138
Dec. 10, 1997 [JP] Japan ................................. 9-339637

[51] Int. Cl.[7] .......................... H01L 27/01; H01L 27/12; H01L 31/0392
[52] U.S. Cl. ............................................. 257/353; 257/347
[58] Field of Search ................................. 257/347, 352, 257/353, 401, 67

[56] References Cited

U.S. PATENT DOCUMENTS 3,974,515  8/1976  Ipri et al. .
4,996,574  2/1991  Shirasaki .
5,115,289  5/1992  Hisamoto et al. .
5,381,029  1/1995  Eguchi et al. ........................... 257/354

FOREIGN PATENT DOCUMENTS 4-34980   2/1992  Japan .
7-273340  10/1995  Japan .

OTHER PUBLICATIONS

F. Assaderaghi et al., "A Dynamic Threshold Voltage MOSFET (DTMOS) for Very Low Voltage Operation", IEEE Electron Device Letters, vol. 15, No. 12, Dec. 1994.

*Primary Examiner*—Ngân V. Ngô
*Attorney, Agent, or Firm*—Antonelli, Terry, Stout & Kraus, LLP

[57] ABSTRACT

To suppress floating substrate in the thin SOI.MOSFET formed on the SOI substrate, the gate (electrode) has a two-layer structure and the upper gate thereof is in contact with the sides of the SOI layer (substrate).

9 Claims, 13 Drawing Sheets

SEMICONDUCTOR DEVICE HAVING SOI-MOSFET

BACKGROUND OF THE INVENTION

The present invention relates to a semiconductor device and more particularly to an insulated gate field effect transistor having an SOI (silicon on insulator) structure.

An SOI-MOSFET (silicon on insulator—metal oxide semiconductor field effect transistor) formed on a thin single crystalline silicon layer on an insulated substrate can be integrated on a large scale on one substrate using a micro fabrication process for silicon. Furthermore, the SOI-MOSFET is suitable for high speed operation because the parasitic capacity of a formed transistor is smaller than that when a conventional single crystalline silicon substrate is used, so that it has been noticed.

A semiconductor device (MOSFET) using a conventional single crystalline silicon substrate biases the channel unit using a substrate electrode. On the other hand, the SOI-MOSFET cannot bias from the lower part of the channel because there is the insulated layer (or insulated substrate) at the bottom of the thin single crystalline silicon layer and there is a problem imposed that it is called a "floating substrate" causing an unstable operation.

Namely, it is reported that the NMOS (N channel MOS) generates a large leakage current in the off state because holes are accumulated in the channel unit and causes a kink (kink effect) in the current characteristic even in the on state. It is known that this problem appears remarkably in an NMOS having a large impact ionization.

An art for solving this problem is disclosed, for example, in Japanese Patent Application Laid-Open 4-34980 and Japanese Patent Application Laid-Open 7-273340.

As described in IEEE Electron Devices Letters, Vol. 15, No. 12, pp. 510 to 512, December 1994, it is considered to bias the channel unit (P-silicon) via the gate electrode. The MOSFET having a structure that the substrate and gate are connected can be regarded as a device in which a FET and a lateral bipolar transistor coexist. It is reported that by such a MOSFET, a characteristic which is excellent particularly in low voltage operation (0.6 V max.) can be obtained.

FIG. 22 is a plane schematic layout showing the device structure disclosed in the aforementioned reference. The plane layout uses the same layout as that of the MOSFET formed on a conventional single crystalline silicon substrate. The characteristic of this structure is that a part of an active region 100 comprising a thin single crystalline silicon layer is patterned in the same shape as that of a gate (electrode) 500. At a contact 600 of the gate, the gate 500 and the active region are in contact with each other by wiring at the same time.

FIG. 23 shows only the active region 100 shown in FIG. 22 and at the contact portion of the gate, the active region is patterned in a so-called dog bone shape. The cross sectional structure of the contact is shown in FIG. 24. The cross sectional structure shown in FIG. 24 is a cross sectional view of the section AA. As shown in FIG. 24, the contact between the gate 500 and the active region 100 is realized by forming a contact hole piercing through the gate 500 and an oxide film 910 of the gate, allowing the active region 100 under the gate oxide film 910 to expose, and forming a metallic wire 700 in the contact hole.

SUMMARY OF THE INVENTION

With respect to the art disclosed in the aforementioned reference, when the active region is to be processed, it is necessary to form a minute pattern in accordance with the gate beforehand. When the contact is to be formed, it is necessary to perform a process of piercing through the gate and to stop the process so as to prevent piercing through the thin silicon layer. It is also necessary to perform contact with the gate on the gate layer side (the inner wall of the contact hole). As a result, a problem of processing arises that no consistency with the ordinary MOS transistor process (the process for forming a MOS transistor on a conventional single crystalline substrate) can be realized and the art is not suited to integration.

Therefore, it is necessary to solve the problem of floating substrate without performing a special process.

An object of the present invention is to provide a semiconductor device having a new SOI structure for giving an electrical potential to the channel forming region.

Another object of the present invention is to provide a semiconductor integrated circuit device having a plurality of insulated gate field effect transistors having a new SOI structure for giving an electrical potential to the channel forming region which are formed on a support substrate.

Still another object of the present invention is to provide a manufacturing method of a semiconductor device having a new SOI structure for giving an electrical potential to the channel forming region.

According to the semiconductor device of the present invention, in a semiconductor device including a single crystalline semiconductor layer mounted on an insulator and an insulated gate field effect transistor having a gate, a source, and a drain electrode which are formed on the single crystalline semiconductor layer, the gate electrode has a 2-layer structure of an upper gate layer and a lower gate layer and the upper gate layer is electrically connected to the channel forming region of the insulated gate field effect transistor.

According to the present invention, the substrate is biased via the gate electrode, so that the problem of floating substrate can be avoided.

As the explanation of the forming process which will be described later shows obviously, the structure of the present invention is realized on a selfalignment basis. Therefore, it is obvious that a problem that no alignment can be realized due to the process of the prior art will not arise.

Namely, the lower gate electrode is processed by continuous etching up to the SOI layer (the single crystalline semiconductor layer) and the side of the SOI layer is exposed. By this processing, the side for contact between the gate and the SOI layer (that is, the channel forming region) is formed. By depositing the upper gate layer on the lower gate layer, the lower gate layer and the SOI layer are automatically connected at the sides thereof.

DESCRIPTION OF THE PREFERRED EMBODIMENTS

Detailed contents of the present invention will be explained hereunder on the basis of the embodiments.

Figure 1:
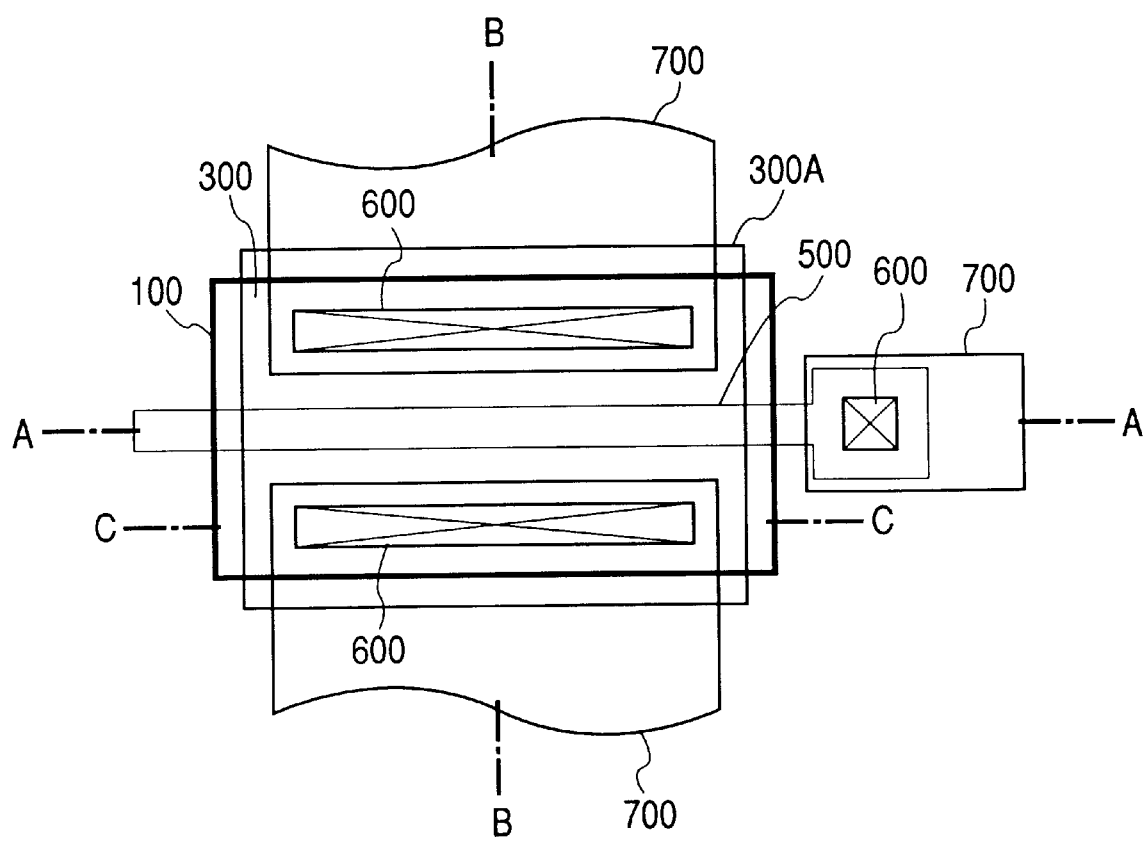
FIG. 1 is a plan view showing the semiconductor device which is a first embodiment of the present invention.

FIG. 1 is a typical plan view showing a mask layout of a semiconductor device having the SOI structure which is a first embodiment of the present invention. Firstly, using an example of an N channel type insulated gate field effect transistor (hereinafter abbreviated to NMOS briefly), the structure and forming process thereof will be explained.

A gate pattern 500 is positioned across a rectangular active region (thin single crystalline silicon layer) 100 indicated by a thick line. Numeral 300A indicates a position of the opening mask when source and drain electrodes of the NMOS are to be formed by ion implantation of N-type impurities. Numeral 600 indicates a contact potion of a wire for each of the source region, drain region, and gate electrode. Numeral 700 indicates a wiring position.

Figure 2:
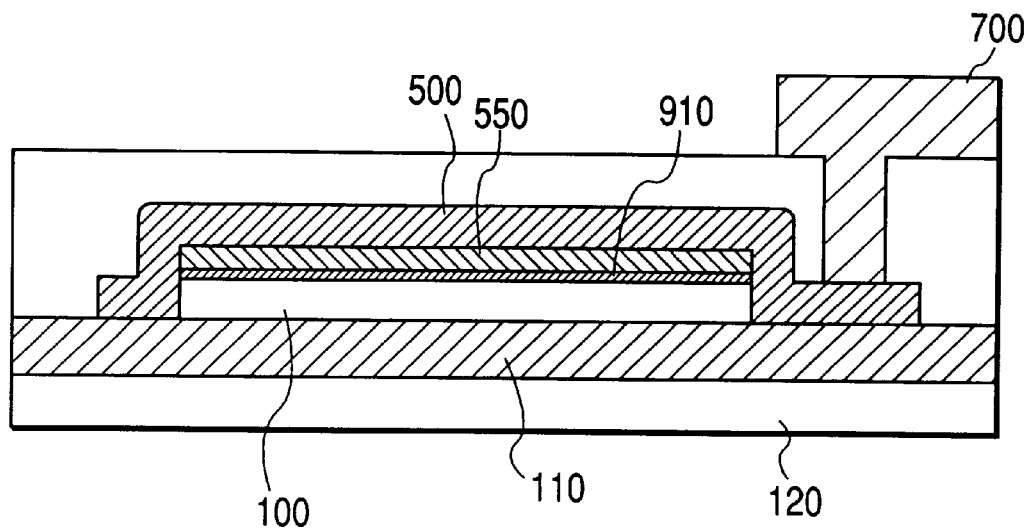
FIG. 2 is a cross sectional view at the line A—A of the semiconductor device shown in FIG. 1.
Figure 3:
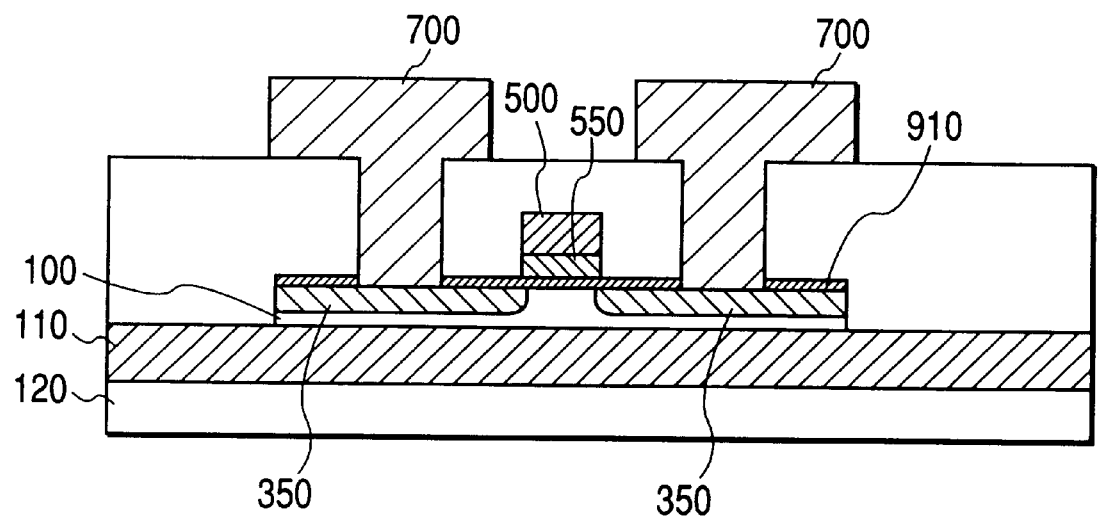
FIG. 3 is a cross sectional view at the line B—B of the semiconductor device shown in FIG. 1.
Figure 4:
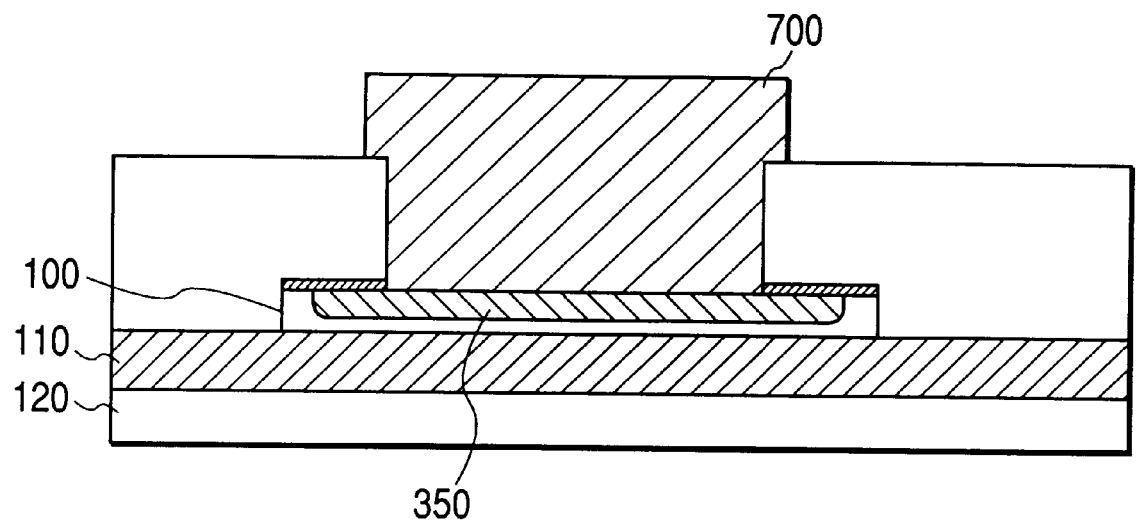
FIG. 4 is a cross sectional view at the line C—C of the semiconductor device shown in FIG. 1.

The sectional structure of the NMOS arranged as mentioned above is shown in FIGS. 2, 3, and 4. FIGS. 2, 3, and 4 are cross sectional views at the line A—A (the perpendicular direction to the channel or the direction of the channel width), the line B—B (the direction of the channel length), and the line C—C shown in FIG. 1 respectively. In the drawings, numeral 120 indicates, for example, a support substrate (body) comprising high resistivity single crystalline silicon. Numeral 110 indicates an insulating film comprising, for example, a silicon oxide film. Numeral 100 indicates a first conductive single crystalline silicon layer (namely, SOI layer) located on the insulating film 110. Numeral 910 indicates a gate insulating film comprising a silicon oxide film concretely. Numeral 550 indicates a lower gate layer and 500 indicates an upper gate layer. Numeral 350 indicates source and drain diffused layers indicating the conductivity type opposite to the first conductivity type. Silicon of the channel unit, that is, the SOI layer 100 indicates the low concentration P-conductivity type. The source and drain diffused layers indicate the N-conductivity type. Numeral 700 indicates a metallic wiring layer, which is in contact with the diffused layers and electrodes respectively.

The characteristics of the present invention are shown in FIG. 2. In FIG. 2, both sides of the SOI layer 100 which are opposite to each other are in contact with the upper gate layer 500 and electrically energized because there is no gate insulating film 910. Therefore, a bias voltage applied to the metallic wiring layer 700 is given to the SOI layer 100 (the channel forming region under the gate electrode) via the upper gate layer 500. The lower gate layer 550 produces a field effect via the gate insulating film 910 and can perform an operation as a field effect transistor (FET). As shown in FIG. 4, the sides of the SOI layer 100 and the diffused layers 350 are arranged away from each other. Namely, the PN junction comprising the diffused layers 350 and the SOI layer 100 is formed inside the SOI layer 100 so that it will not arrive at the sides of the SOI layer 100. Since there is a distance between the contact portion with the gate and the diffused layers, a sufficient breakdown voltage can be obtained between the gate and the drain.

Figure 5:
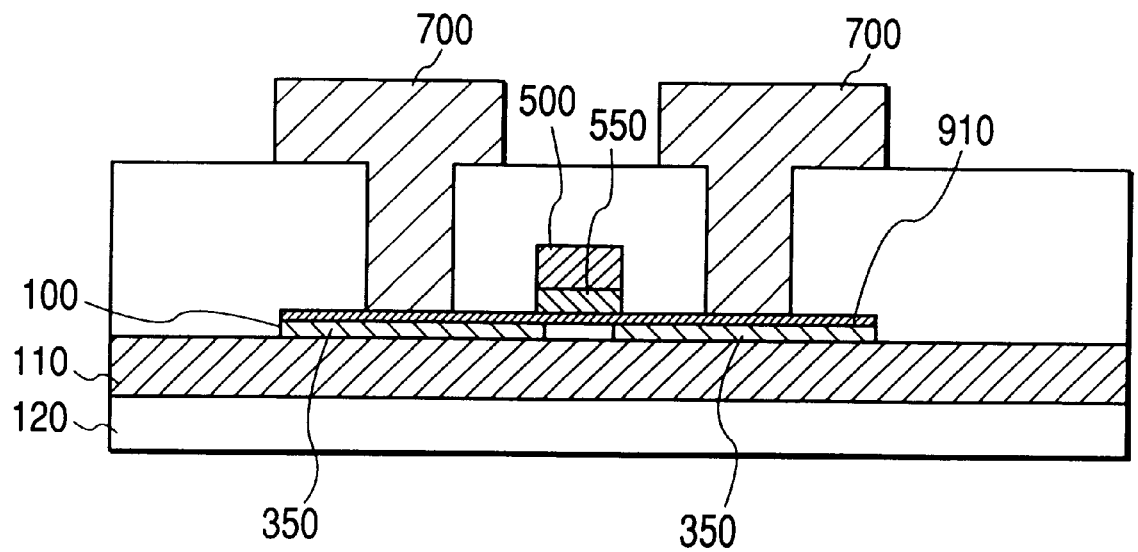
FIG. 5 is a cross sectional view showing the semiconductor device of the second embodiment of the present invention.
Figure 6:
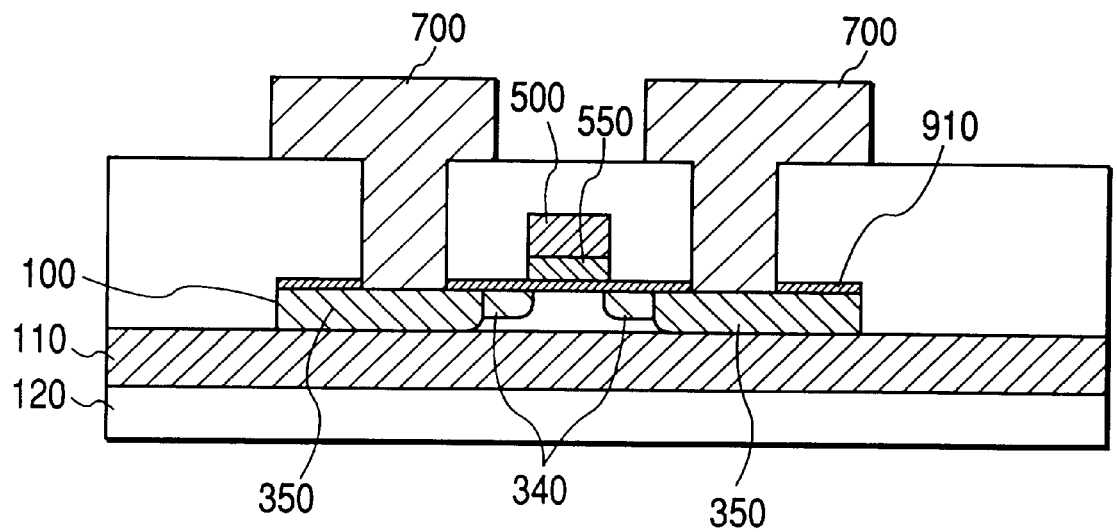
FIG. 6 is a cross sectional view showing the semiconductor device of the third embodiment of the present invention.
Figure 7:
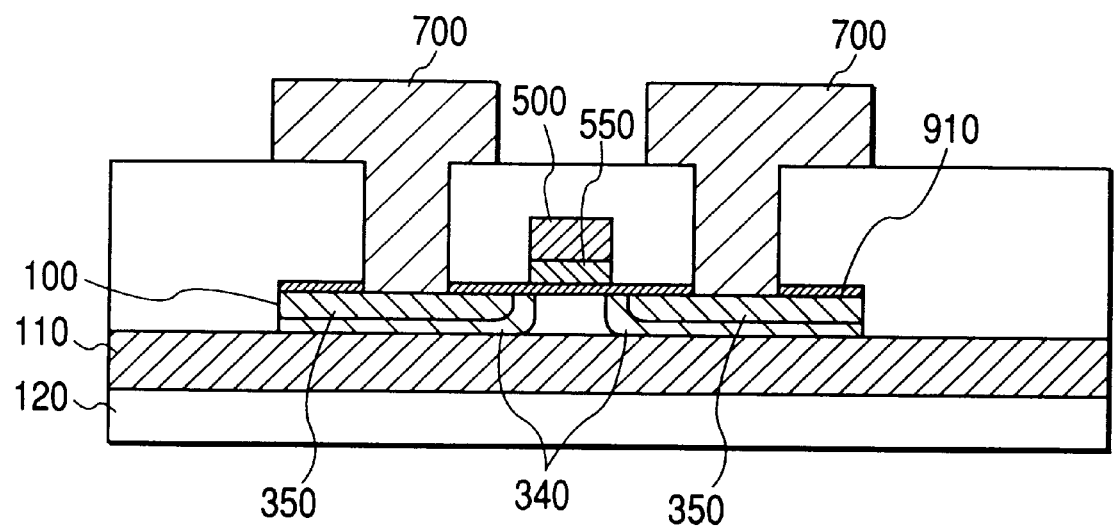
FIG. 7 is a cross sectional view showing the semiconductor device of the fourth embodiment of the present invention.

In correspondence with the sectional structure shown in FIG. 3, other embodiments are shown in FIGS. 5, 6, and 7 respectively.

The second embodiment shown in FIG. 5 shows a case that the SOI layer 100 is made thinner. The thickness of the SOI layer 100 is, for example, 10 nm and the thickness of the gate insulating film 910 is about ½ of the thickness of the SOI layer 100.

The electrical connection between the gate and the channel forming region in this embodiment is realized by the structure shown in FIG. 2.

According to this embodiment, characteristic improvement in the subthreshold operation region can be realized. Namely, since the gate electrode and the channel active region are electrically connected, when the gate voltage (VG) of the transistor (NMOS) is 0 V (the off state), the off state of the transistor is made stronger. Namely, the threshold voltage is increased. Therefore, the threshold leakage current can be reduced.

Though it is an intrinsic effect of the SOI structure, the parasitic capacity of the diffused layers can be reduced.

The third embodiment shown in FIG. 6 is an NMOS having the SOI structure with shallow low-concentration impurity diffused layers 340 provided which is known as an LDD (lightly doped drain) structure. Namely, the layers 340 have a lower concentration than that of the source and drain diffused layers to which the metallic wires of the diffused layers are connected and formed shallowly. By use of the LDD structure like this, the hot electron effect can be reduced and an NMOS having the SOI structure can be made minuter.

The electrical connection between the gate and the channel forming region in this embodiment is realized by the structure shown in FIG. 2.

In FIG. 6, a side wall spacer for the gate electrodes 500 and 550 is omitted.

The fourth embodiment shown in FIG. 7 has a structure that the high-concentration diffused layers 350 to which the metallic wiring layer 700 is connected are covered with the low-concentration diffused layers 340 which are called a DDD (double diffused drain) structure and the drain breakdown voltage can be increased.

Also in this embodiment, the electrical connection between the gate and the channel forming region is realized by the structure shown in FIG. 2.

In FIG. 7, the high-concentration diffused layers 350 are away from the edges of the gate electrodes 500 and 550. However, actually in the same way as with the low-concentration diffused layers 340, the high-concentration diffused layers 350 are formed by self-alignment for the edges of the gate electrodes 500 and 550. As a result, the edges of the high-concentration diffused layers 350 in contact with the gate insulating film 910 are located under the gate electrode.

Next, the manufacturing method of the first embodiment shown in FIG. 1 will be explained.

FIGS. 8 to 11 are cross sectional structure diagrams showing the manufacturing process of the first embodiment. FIGS. 8 to 11 show the manufacturing process at the cross section at the line A—A of the semiconductor device including the gate shown in FIG. 1.

Figure 8:
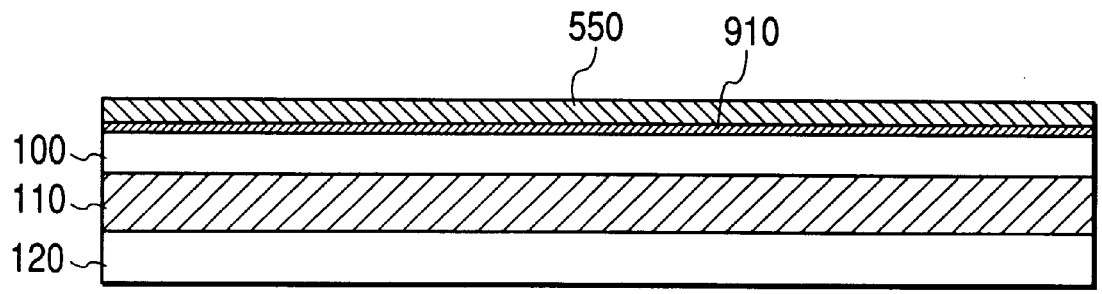
FIG. 8 is a cross sectional view showing the manufacturing process of the semiconductor device shown in FIG. 1.

As shown in FIG. 8, the silicon oxide film 110 is formed on the silicon substrate 120 as a support substrate. The silicon substrate 120 is a relatively high resistivity single crystalline silicon. On the silicon oxide film 110, the single crystalline silicon layer (SOI layer) 100 which is 100 nm in thickness and of the P-conductivity type and has a resistivity of 1 Ω.cm is formed. By doing this, the SOI substrate as a starting material is prepared. On the surface of this SOI substrate, the gate oxide film 910 with a thickness of 10 nm is formed by thermal oxidation and the polycrystalline silicon layer 550 which is doped to the P-conductivity type using the CVD method is deposited in a thickness of 100 nm.

Figure 9:
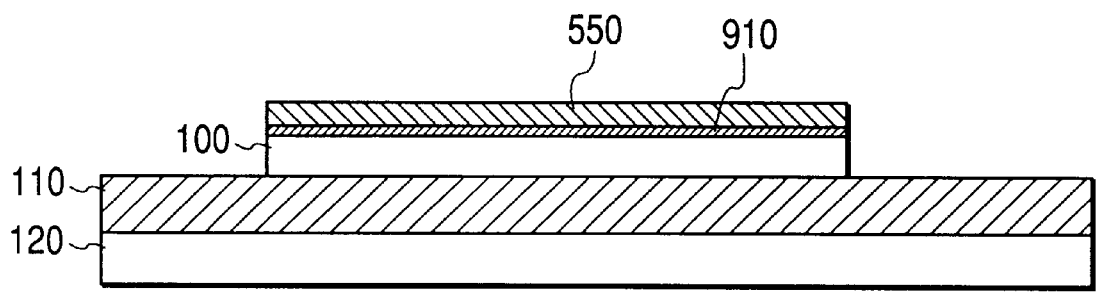
FIG. 9 is a cross sectional view showing the manufacturing process of the semiconductor device following FIG. 8.

Next, as shown in FIG. 9, the active region is patterned using the photoresist method. Namely, the lower gate layer 550, the gate insulating film 910, and the SOI layer 100 are sequentially etched using a photoresist mask. In this case, the sides of the SOI layer 100 can be exposed in a shape of active region.

The active region means a region where an insulated gate field effect transistor is formed and includes the source and drain regions and the channel forming region between them.

Figure 10:
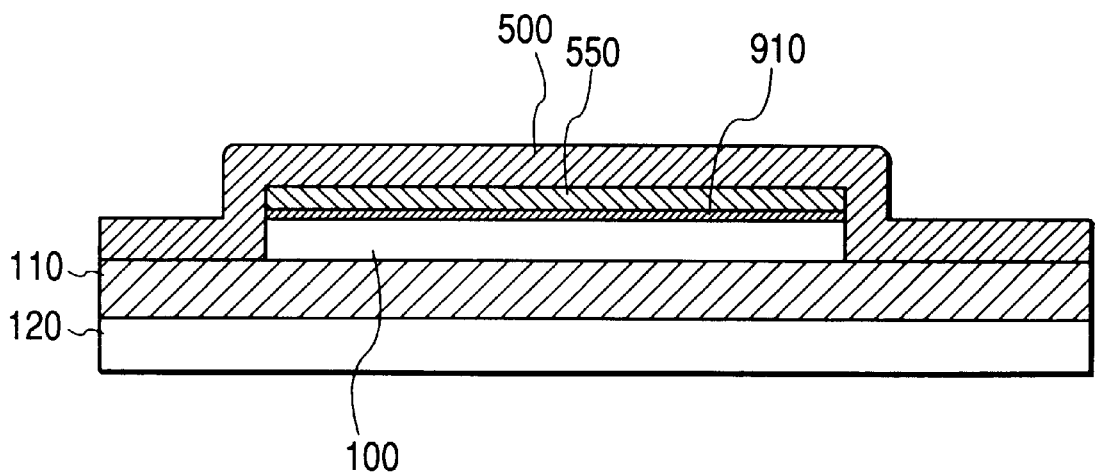
FIG. 10 is a cross sectional view showing the manufacturing process of the semiconductor device following FIG. 9.

Next, as shown in FIG. 10, the polycrystalline silicon layer (upper gate layer) 500 in which boron is doped in high concentration is deposited. By doing this, the lower gate layer 550 and the SOI layer 100 are connected on the exposed sides of the SOI layer. Doped boron in the polycrystalline silicon is diffused from the sides of the SOI layer by the subsequent heat treatment process (for example, heat treatment such as forming of CVD protective film) and forms a high-concentration layer in the SOI layer. This high-concentration layer can be made thinner by lowering the temperature of the process (for example, 60000° C. to 700° C. or so). Therefore, it is omitted in the drawing.

Figure 11:
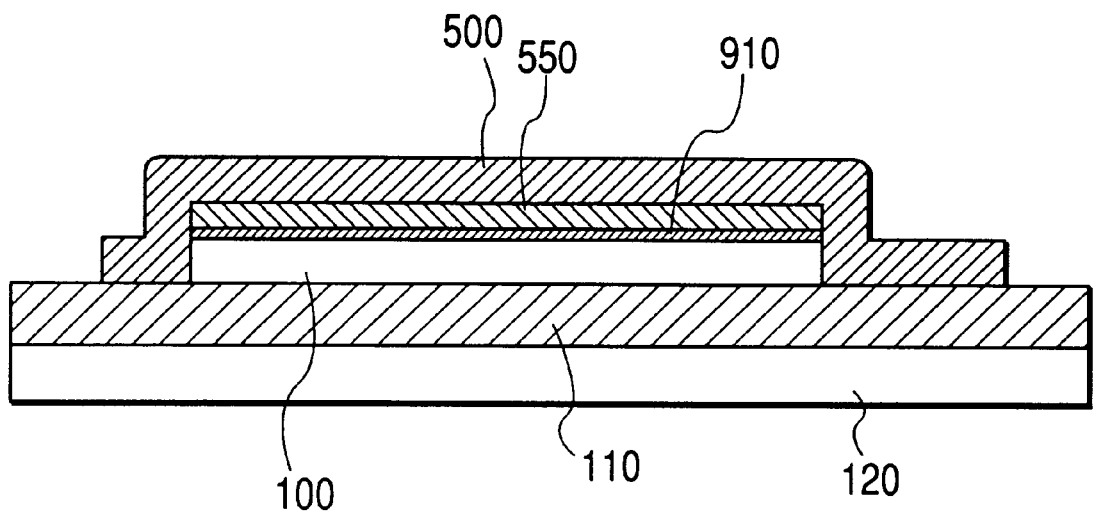
FIG. 11 is a cross sectional view showing the manufacturing process of the semiconductor device following FIG. 10.

Next, as shown in FIG. 11, the gate electrode is patterned by the photoresist method. Concretely, the gate electrode is processed by anisotropic dry etching. In this case, on the SOI layer 110, the upper gate layer 500 and the lower gate layer 550 can be processed together. Namely, as shown in FIG. 1, the gate electrode (500) is formed.

Generally, when there is a level difference like the SOI layer 100, an etching residue of the upper gate layer 550 is generated on the sides of the SOI layer. However, by using a condition of a high etching selection ratio of the gate insulating film 910 and the upper gate layer 550, the layers 500 and 550 can be processed.

Since the forming process is the same as that of an ordinary MOSFET, the drawing will be omitted. By performing ion-implantation in which arsenic is accelerated with an ion dose of $5 \times 10_{15}$ cm$^2$ and implantation energy of 25 keV using the gate electrode 500 and the opening mask 300A (see FIG. 1) as a mask and then annealing it, the diffused layers (source and drain regions) 300 are formed. By using the opening mask 300A, the interval between the diffused layers and the sides of the SOI layer which is in contact with the gate electrode is set to 0.3 micron (am). By doing this, the junction breakdown voltage between the P-type high concentration layer (not shown in the drawing due to shallow junction) diffused and formed from the gate 500 to the surface of the SOI layer and the diffused layers 300 can be increased. BPSG (boro-phosho silicate glass) is deposited by the CVD method and flattened by heat-treating and then a contact is formed on each electrode. By depositing and processing metallic wires, an element (NMOS) is formed.

As the aforementioned process makes it clear, without forming a contact pattern on the SOI layer, the substrate 100 and the gate electrode can be made conductive.

By reversing the conductivity type used here, a PMOS (P channel MOS) can be formed. It is clear that by forming a P-conductivity type SOI layer and an N-conductivity type SOI layer respectively on the silicon oxide layer 110 and using the PMOS forming mask and NMOS forming mask appropriately, the CMOS process can be realized.

Figure 12:
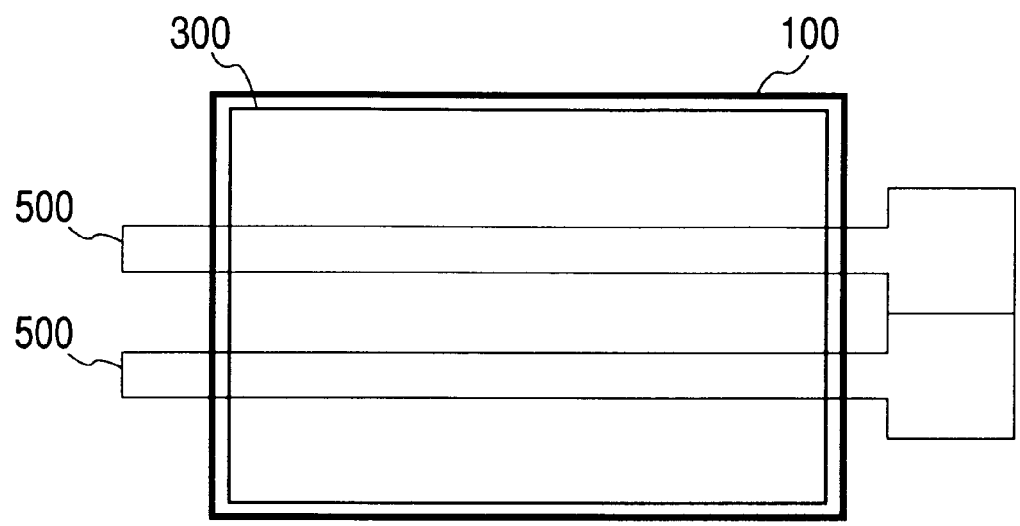
FIG. 12 is a plane schematic layout of the semiconductor device of the fifth embodiment of the present invention.

FIG. 12 shows the fifth embodiment. The drawing shows a layout of SOI-NMOS having a so-called dual gate structure in which a plurality of gates (electrodes) are arranged in parallel with each other particularly so as to generate a large current. In FIG. 12, the diffused layer 300 is formed smaller than the pattern of the active region (SOI layer) 100.

Also in this embodiment, each gate electrode 500, as shown in FIG. 2, has a two-layer structure comprising an upper gate layer and a lower gate layer and the upper gate layer and the sides of the active region are in contact with each other.

When the structure and forming process of the present invention are used, contact of the electrode (P-conductivity type gate electrode 500) having the conductivity opposite to that of the diffused layer with the active region can be easily realized because they are of the same conductivity type. A bipolar transistor can be obtained at the same time.

Figure 13:
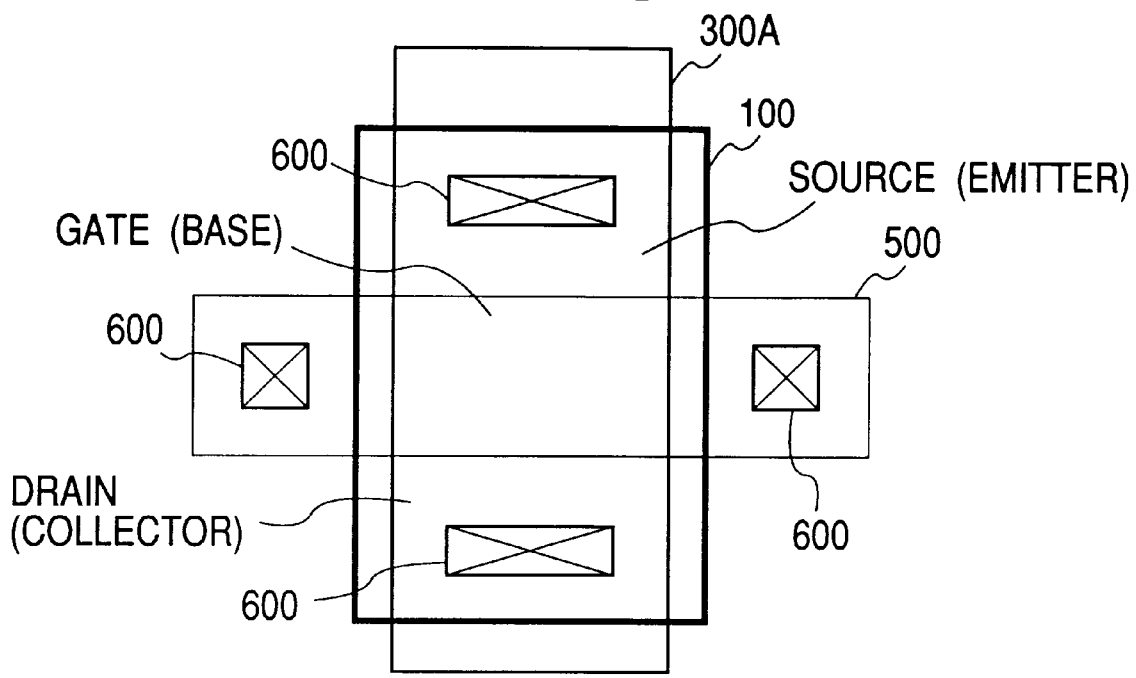
FIG. 13 is a plane schematic layout of the semiconductor device of the sixth embodiment of the present invention.

FIG. 13 shows the basic arrangement of the polar transistor of the sixth embodiment. For example, in the case of PMOS, the transistor is structured so that the N-conductivity type SOI layer to which the gate 500 is connected is set as an N type base, and the P type source region and P type drain region are set as an emitter and collector respectively, and the transistor can be operated as a lateral PNP bipolar transistor.

Figure 14:
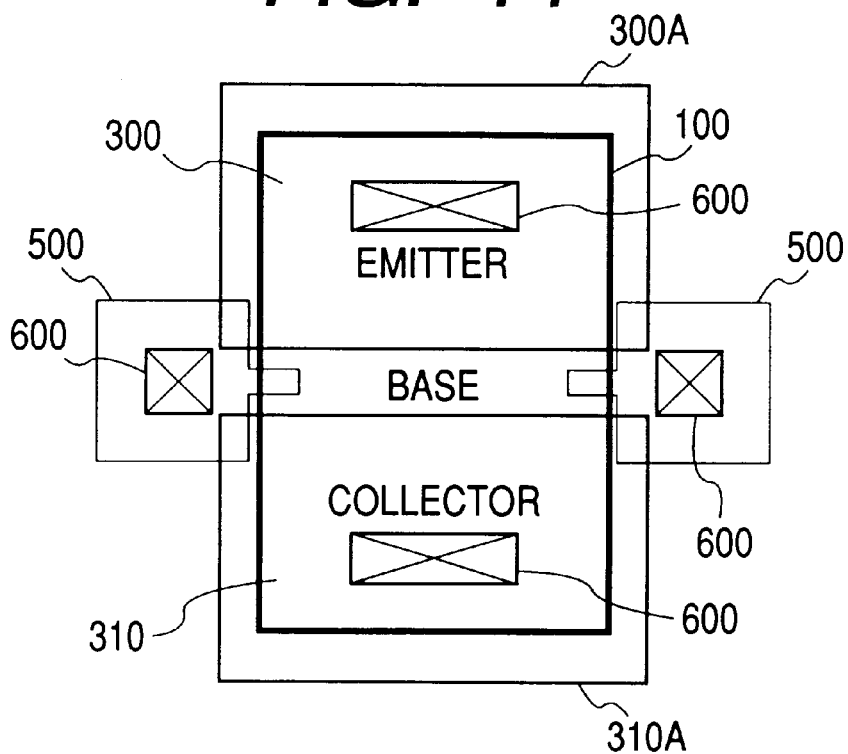
FIG. 14 is a plane schematic layout of the semiconductor device of the seventh embodiment of the present invention.

FIG. 14 is a plane schematic layout of the semiconductor device of the seventh embodiment of the present invention. This embodiment constitutes only a lateral bipolar transistor instead of MOSFET. Namely, as shown in FIG. 14, the electrodes 500 are patterned as a base pull-out electrode. In the same way as with the sixth embodiment mentioned above, the electrodes 500 are connected to the sides of the SOI layer 100. The emitter region and collector region can be selectively formed inside the SOI layer by the well-known ion implantation using the opening mask patterns 300 and 310 as a mask.

Figure 15:
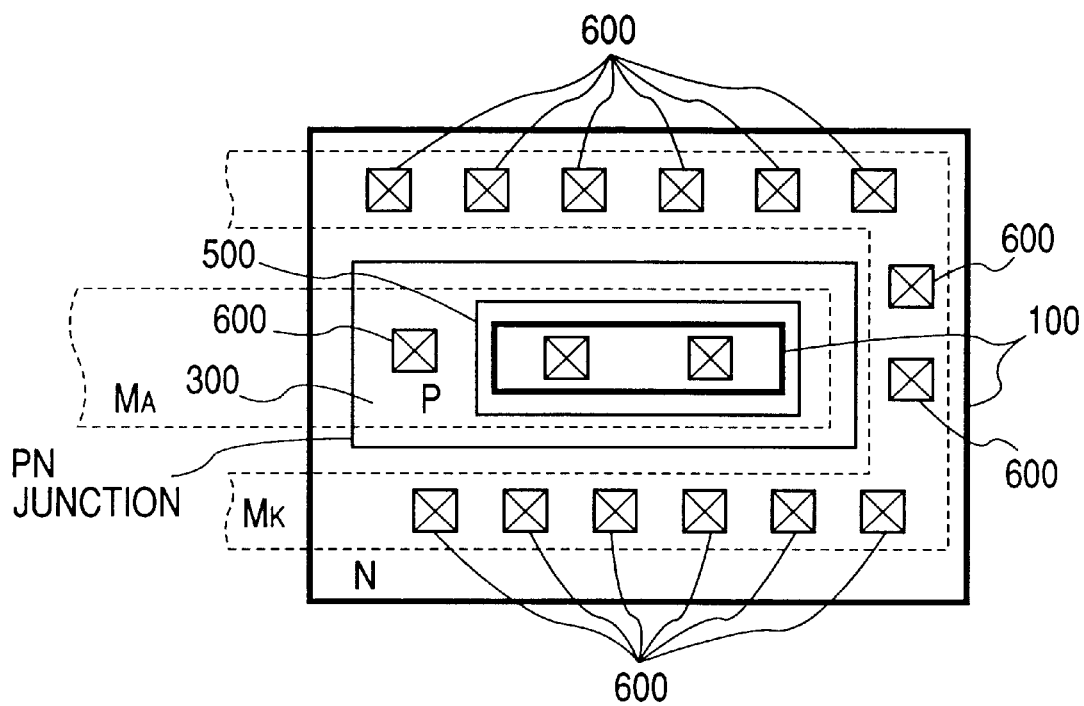
FIG. 15 is a plane schematic layout of the semiconductor device of the eighth embodiment of the present invention.

FIG. 15 is a plane schematic layout of the semiconductor device of the eighth embodiment of the present invention.

As shown in FIG. 15, it is possible to arrange the active region (SOI layer) 100 in a ring shape on an insulating film (not shown in the drawing) and form a device. This device can be applied, for example, as an input protection diode (PN junction diode) of SOI-MOSFET. Namely, the P-conductivity type diffused layer 300 is selectively formed on the N-conductivity type SOI layer 100 so as to reach the insulating film. With the side wall inside the ring-shaped SOI layer 100 on which the P-conductivity type high-concentration impurity diffused layer 300 is formed, the electrode 500 is in contact. The main surface of the electrode 500 and the main surface of the SOI layer are covered with a layer insulating film (not shown in the drawing) and contact holes 600 are arranged on the layer insulating film. As shown by dotted lines, anode lines MA and MK are connected.

According to this embodiment, the electrode 500 is in contact with the side wall inside the ring-shaped SOI layer opposite to the whole PN junction, so that it is possible to send a surge current uniformly.

Figure 16:
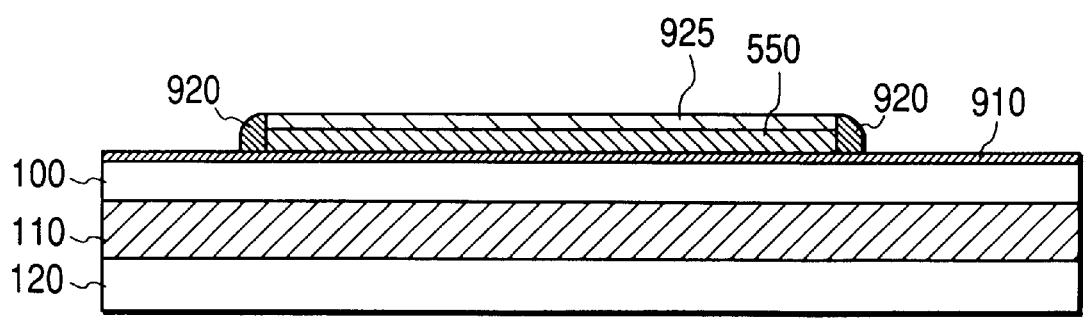
FIG. 16 is a cross sectional view showing the manufacturing process of the semiconductor device of the ninth embodiment of the present invention.
Figure 17:
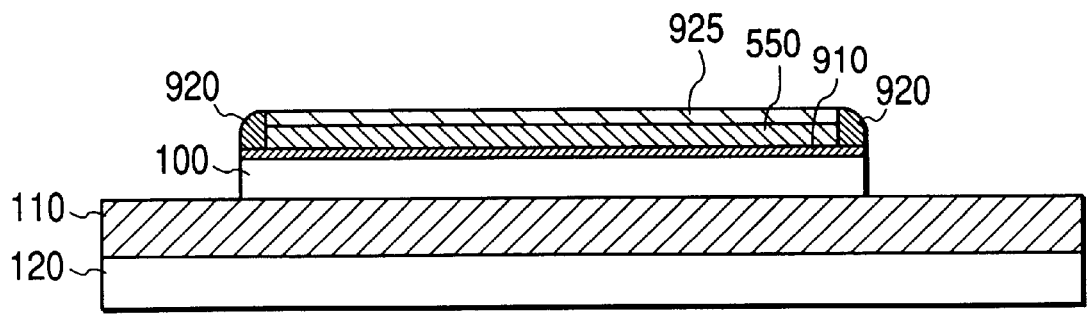
FIG. 17 is a cross sectional view showing the manufacturing process of the semiconductor device of the ninth embodiment of the present invention.
Figure 18:
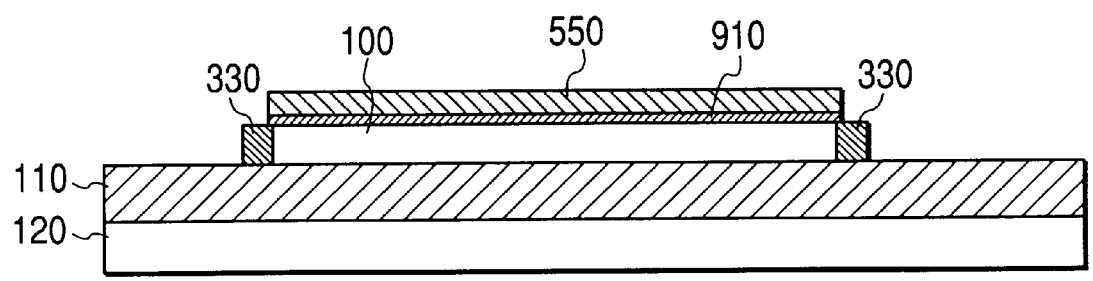
FIG. 18 is a cross sectional view showing the manufacturing process of the semiconductor device of the ninth embodiment of the present invention.

Next, a manufacturing method of another semiconductor device which is a ninth embodiment will be shown in FIGS. 16 to 18.

The cross sectional views shown in FIGS. 16 to 18 correspond to cross sectional views in the cutting direction of the line A—A.

When the lower gate layer 550 shown in FIG. 9 is to be processed, a silicon nitride film 925 is deposited on the lower gate layer 550, and the silicon nitride film 925 and the lower gate layer 550 are etched, and the processing is stopped once at the gate insulating film 910. Next, by a spacer forming art in which the known CVD method and dry etching (anisotropic etching) are combined, a spacer 920 can be formed on the sides of the lower gate layer 550 (FIG. 16).

Next, the SOI layer 100 is processed using the silicon nitride film 925 and the spacer 920 as a mask (FIG. 17).

Next, by removing the spacer 920 and the silicon nitride film 925 and performing ion implantation using the lower gate layer 550 as a mask, P-conductivity type high-concentration impurity diffused layers 330 can be provided on a self-alignment basis in the peripheral area of the SOI layer 100. Hereafter, when the forming process (gate etching) of the first embodiment shown in FIG. 10 is performed, an element can be obtained (FIG. 18). When this process is performed, even if a metallic material is used as the upper gate layer 500, it can be made conductive with the SOI layer with a low resistance without having a schottky barrier.

In the structure of the present invention, it is obvious that a gate can be formed by laminating different materials and a combination thereof can be designed so as to obtain a necessary gate resistance. The gate constitution of 2 layers is mentioned above. However, for example, it is possible that the lower gate comprises a laminated film of N type polycrystalline silicon and titanium nitride (TiN) on the N type polycrystalline silicon and the upper gate comprises P type polycrystalline silicon. Namely, a laminated layer gate structure such as a polyside gate or a salicide gate which is developed so as to reduce the resistance of the gate and set a threshold voltage can be used as it is.

Figure 19:
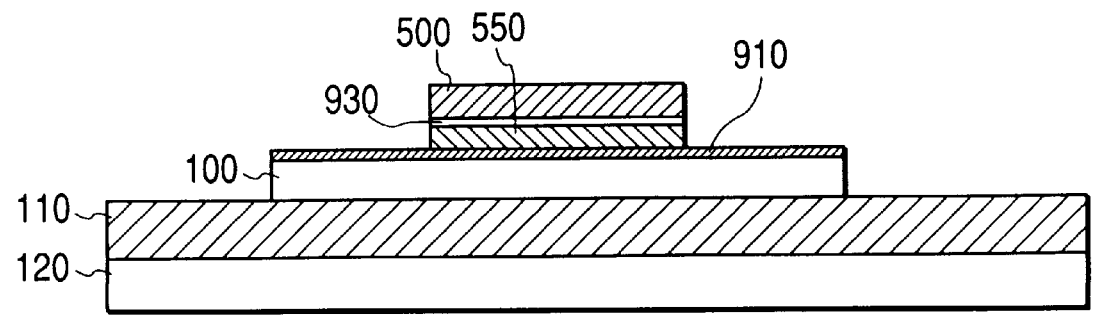
FIG. 19 is a cross sectional view showing the semiconductor device of the tenth embodiment of the present invention.

FIG. 19 shows the 10th embodiment in which an insulating film 930 is located between the upper gate 500 and the lower gate 550. By doing this, a floating gate memory cell can be obtained easily.

Therefore, a semiconductor integrated circuit device in which a MOSFET which has a two-layer structure comprising an upper gate layer and a lower gate layer like the aforementioned embodiment (for example, the first embodiment) and is in contact with the sides of the upper gate layer and of the active region and the aforementioned floating gate memory cell are loaded in the SOI layer 100 can be formed.

Figure 20:
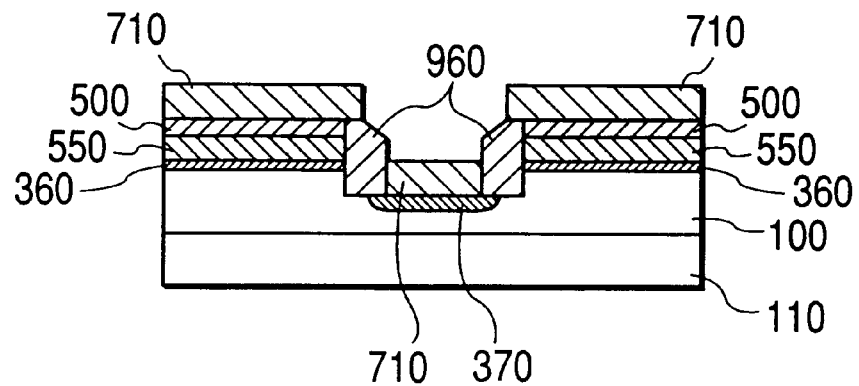
FIG. 20 is a cross sectional view showing the semiconductor device of the eleventh embodiment of the present invention.
Figure 21:
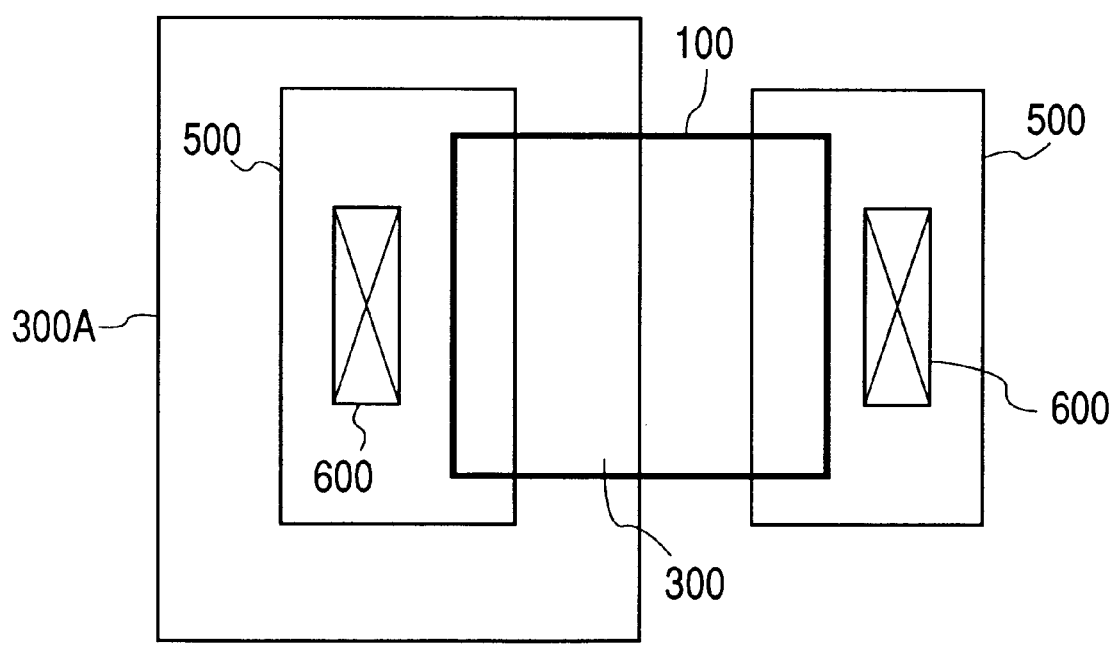
FIG. 21 is a plane schematic layout of the semiconductor device of the twelfth embodiment of the present invention.
Figure 22:
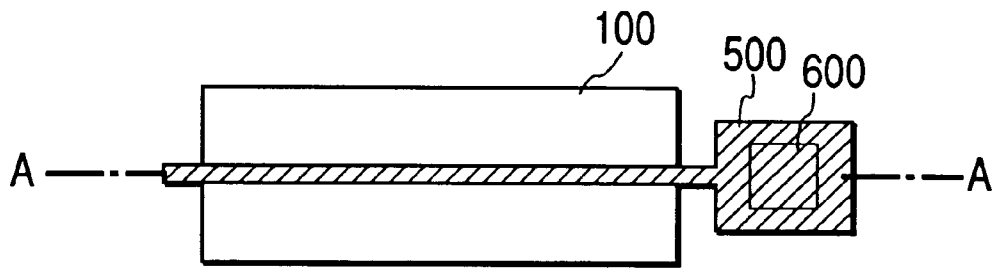
FIG. 22 is a plan view of a conventional semiconductor device having the SOI structure.
Figure 23:
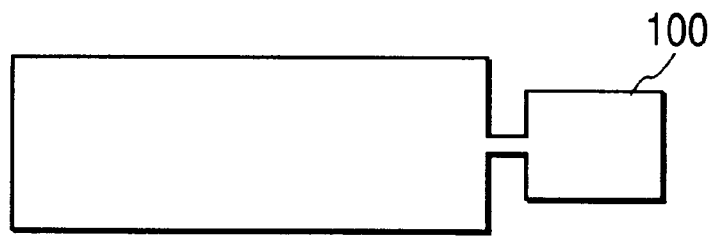
FIG. 23 is a plan view of a thin single crystalline silicon layer of the conventional semiconductor device shown in FIG. 22.
Figure 24:
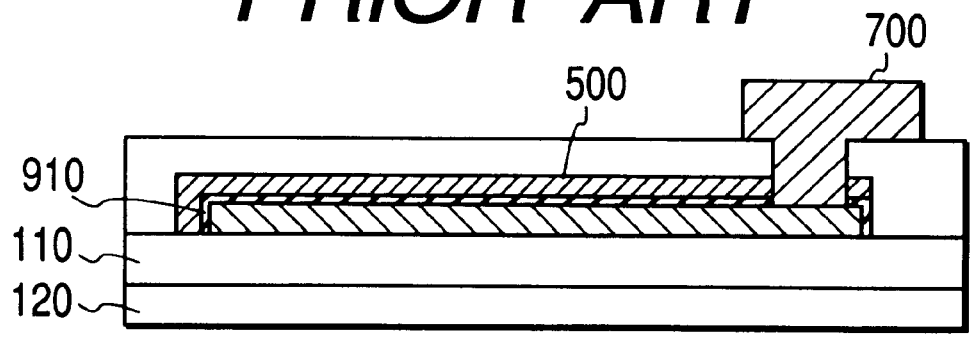
FIG. 24 is a cross sectional view at the line A—A of the conventional semiconductor device shown in FIG. 22.

FIGS. 20 and 21 show the eleventh embodiment and the twelfth embodiment respectively and show the MOSFET of the previous embodiment as well as a deformation example of a PN junction diode which can be formed on the SOI layer 100.

The diode shown in FIG. 20 comprises PN junction between the P-conductivity type SOI layer (substrate) 100 and the N type layer 370. The forming method of this diode will be described briefly hereunder.

Firstly, no gate insulating film is put on the surface of the substrate 100 and the lower gate layer 550 and the upper gate layer 500 are deposited. Concretely, the gate insulating film 910 shown in FIG. 8 is formed and then a part of the gate insulating film 910 formed on the surface of the substrate 100 where a diode is to be formed is removed. Then, the lower gate layer 550 and the upper gate layer 500 are deposited. Since the gate insulating film is not found, the substrate 100 can be etched at the gate electrode patterning process. Using the level differences of the sides generated at this time, insulating film spacers 960 are formed. Tungsten 710 is selectively deposited on the exposed polycrystalline silicon 500 and the substrate 100. Phosphorus is ion-implanted into the substrate 100 before tungsten deposition and the specified N type layer 370 is formed by the insulating film spacers 960. Numeral 360 indicates a P type impurity layer diffused from 550 because there is no gate insulating film.

This embodiment can form a PN junction diode selectively using two-layer gate pattern etching.

In the CMOS process, both N type and P type are used for polycrystalline silicon for the gates. By using it, a diode can be formed. FIG. 21 shows a typical layout. Contact takes place from the left side (CNT1) of the active region (P-conductivity SOI layer) 100 to the N-conductivity type region and contact from the right side (CNT2) to the P-conductivity type region can be obtained.

The N-conductivity type region 300 is formed by implantation of arsenic ions using the opening mask 300A.

Figure 25:
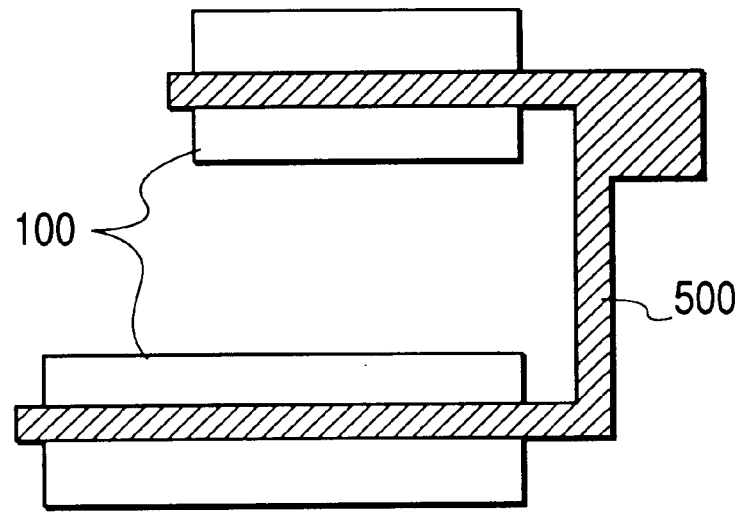
FIG. 25 is a plan view of the semiconductor integrated circuit device of the thirteenth embodiment of the present invention.
Figure 26:
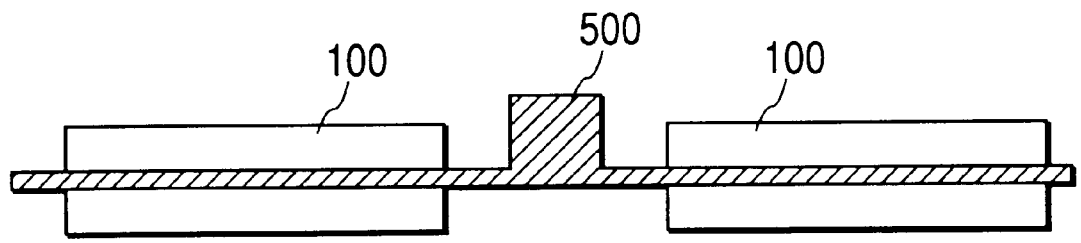
FIG. 26 is a plan view of the semiconductor integrated circuit device which is a fourteenth embodiment of the present invention.
Figure 27:
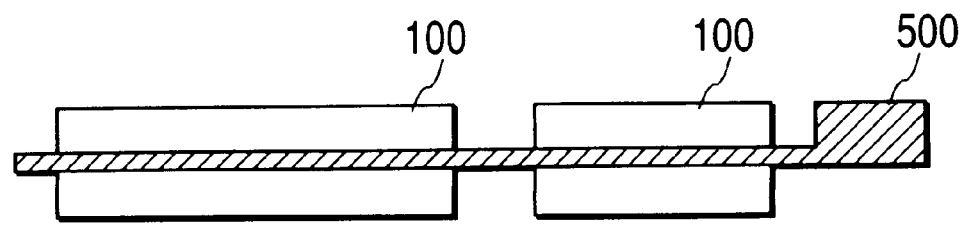
FIG. 27 is a plan view of the semiconductor integrated circuit device which is a fifteenth embodiment of the present invention.

The contact between the gates and the substrate (SOI layer) of the present invention (hereinafter referred to as the substrate contact) is valid when the gates extend over a plurality of active regions. Namely, the present invention has a structure suited to high integration. FIGS. 25, 26, and 27 show the thirteenth, fourteenth, and fifteenth embodiments respectively. Arrangement examples of typical active regions 100 and gate 500 which are used in an LSI are shown respectively.

In the conventional substrate contact, it is necessary to provide a plurality of contact forming regions.

However, according to the present invention, the substrate contact is realized on the side walls of the active regions 100, so that the substrate contact can be easily realized for the active regions arranged as shown in FIG. 25 to 27. Therefore, a highly integrated semiconductor integrated circuit device which is driven at a low voltage can be obtained. However, in the device structure of the present invention, the leakage current increases at a high voltage ($V_{cc}$=1.2 V to 1.5 V), so that the structure is valid in an operation particularly at a low voltage ($V_{DL} \leq 0.6$ V). Therefore, in a semiconductor integrated circuit device (hereinafter referred to as IC) in which a SOI.MOSFET having no substrate contact and a SOI.MOSFET having substrate contact like the present invention are integrated, it is possible that voltage limiter as shown in FIG. 28 is provided in the IC and the internal circuit which is operated by the drive voltage VDL comprises the aforementioned SOI.MOSFETs of the present invention.

Figure 28:
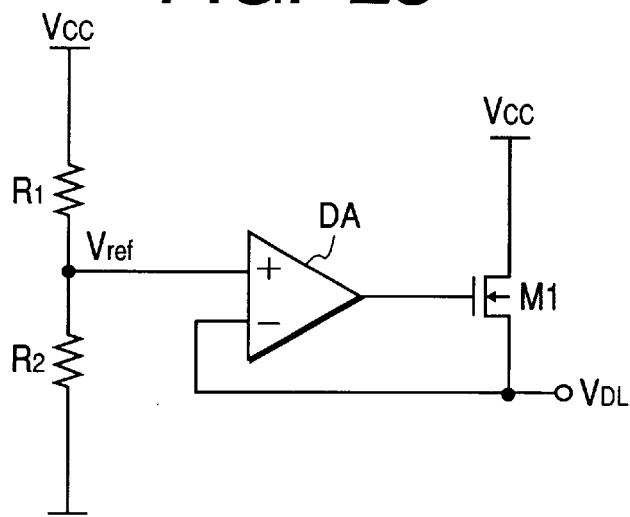
FIG. 28 is a circuit diagram showing a power circuit (voltage limiter) for driving the semiconductor device (or semiconductor integrated circuit device) of each embodiment of the present invention.

In FIG. 28, the resistors R1 and R2 are set so as to obtain the reference voltage Vref ($\leq 0.6$ V). Symbol DA indicates a differential amplifier.

Figure 29:
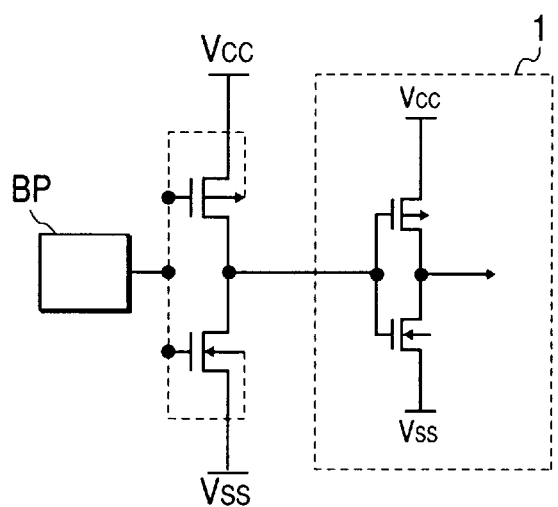
FIG. 29 is a circuit diagram showing an input-output protective circuit using the semiconductor device of the present invention as a protective element.

An embodiment in which the SOI.MOSFETs of the present invention are used as a gate protective circuit element is shown in FIG. 29. In this embodiment, by connecting a large invertor (CMOS invertor) comprising the present invention between the bonding pad BP and the internal circuit 1, the IC can be operated as a gate protective element. Namely, the gate electrodes are connected to the power source $V_{cc}$ or the grounding cable $V_{ss}$ respectively via the PN junction. As a result, for example, when a positive surge voltage is applied to the bonding pad BP, it is extracted to the grounding cable $V_{ss}$ via the PN junction of the NMOS. On the other hand, when a negative surge voltage is applied to the bonding pad BP, it is extracted to the grounding cable $V_{cc}$ via the PN junction of the PMOS.

Figure 30:
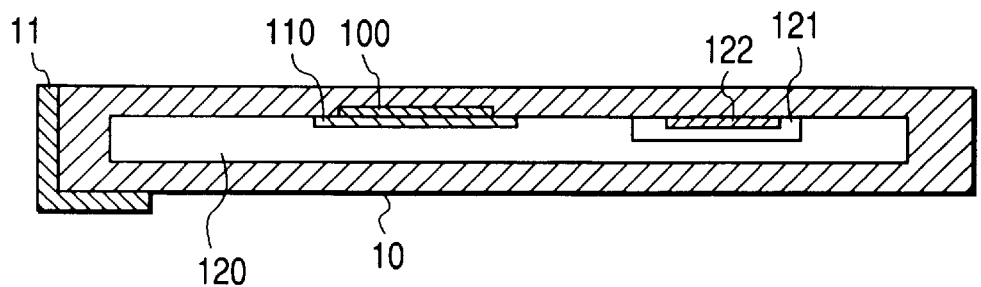
FIG. 30 is a cross sectional view showing an electronic card in which the semiconductor device (or the semiconductor integrated circuit device) of the present invention is incorporated.

According to the present invention, the semiconductor device has a characteristic that it operates at a low voltage. Therefore, a photodetector using the photovoltaic effect in which a problem of low voltage is imposed, for example, a solar cell and SOI.MOSFETs of the present invention can be integrated. For example, the electronic card shown in FIG. 30 can be assembled. In FIG. 30, a photodetector 122 is formed on a well provided on the silicon substrate 120 and the embedded oxide film 110 is formed in a part of the substrate 120. On the embedded oxide film 110, SOI.MOSFETs of the present invention are formed. And, for example, the silicon substrate 120 is sealed by a transparent resinous substance 10. At the corner of the resinous substance 10, an external terminal 11 is provided.

It is possible to provide SOI.MOSFETs of the present invention on one main surface of the substrate 120, provide a photodetector on the other main surface opposite to the one main surface, protect the one main surface with an opaque resinous substance, and protect the other main surface with a transparent resinous substance.

As mentioned above, according to the present invention, the gate electrodes are electrically in contact with the substrate which is a channel, accordingly power can be supplied to the channel, so that a problem of floating substrate can be suppressed.

What is claimed is:

1. A semiconductor device including a support substrate having a main surface comprising an insulator, a first conductive single crystalline semiconductor layer patterned on said insulator main surface, a gate insulating film formed on the main surface of said single crystalline semiconductor layer, a first gate layer patterned on said gate insulating film, and a second gate layer connected to said first gate layer, wherein said second gate layer is connected at the sides of said single crystalline semiconductor layer.

2. A semiconductor device according to claim 1, wherein said support substrate comprises a single crystalline semiconductor and said insulator having a silicon oxide film formed on the surface of said semiconductor.

3. A semiconductor device including a support substrate having a main surface comprising an insulator, a first conductive single crystalline semiconductor layer having a rectangle formed on said insulator main surface, a gate insulating film formed on the main surface of said single crystalline semiconductor layer, a first gate layer patterned on said gate insulating film, and a second gate layer connected to said first gate layer, wherein said second gate layer is connected at both sides of said single crystalline semiconductor layer which are opposite to each other.

4. A semiconductor device according to claim 3, wherein said support substrate comprises a single crystalline semiconductor and said insulator having a silicon oxide film formed on the surface of said semiconductor.

5. A semiconductor device according to claim 3, wherein said first gate layer comprises a laminated film of polycrystalline silicon and titanium nitride and said second gate layer comprises polycrystalline silicon.

6. A semiconductor integrated circuit device including a support substrate having a main surface comprising an insulator, first conductive single crystalline semiconductor layers having a plurality of rectangles formed on said insulator main surface, gate insulating films formed on the main surfaces of said respective single crystalline semiconductor layers, first gate layers patterned on said respective gate insulating films, and second gate layers which are formed extending over said plurality of single crystalline semiconductor layers and connected to said first gate layers, wherein said second gate layers are connected at the sides of said respective single crystalline semiconductor layers.

7. A semiconductor device including a single crystalline semiconductor layer mounted on an insulator and an insulated gate field effect transistor having a gate, a source, and a drain electrode which are formed on said single crystalline semiconductor layer, wherein said gate electrode has a 2-layer structure and the upper gate layer is electrically connected to the channel forming region of said insulated gate field effect transistor.

8. A semiconductor device according to claim 7, wherein the sides of said silicon single crystalline layer and said gate electrode are in contact with each other.

9. A semiconductor device according to claim 7, wherein said lower gate layer and the active region are formed by the same pattern.

* * * * *